United States Patent
Wu et al.

(10) Patent No.: US 7,259,027 B2
(45) Date of Patent: Aug. 21, 2007

(54) LOW ENERGY DOSE MONITORING OF IMPLANTER USING IMPLANTED WAFERS

(75) Inventors: Jingang Wu, Shanghai (CN); Jianpeng Song, Shanghai (CN); Minggang Chang, Shanghai (CN); Chinte Huang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 256 days.

(21) Appl. No.: 10/773,728

(22) Filed: Feb. 6, 2004

(65) Prior Publication Data

US 2005/0142671 A1 Jun. 30, 2005

(30) Foreign Application Priority Data

Dec. 30, 2003 (CN) .......................... 200310122977

(51) Int. Cl.
*G01R 31/26* (2006.01)
*H01L 21/00* (2006.01)

(52) U.S. Cl. .............................. 438/14; 438/15; 438/16

(58) Field of Classification Search .................. 438/14, 438/15, 16, 486, 796, 308, 476, 795, 798, 438/799; 356/72
See application file for complete search history.

(56) References Cited

U.S. PATENT DOCUMENTS

| | | | | |
|---|---|---|---|---|
| 4,181,538 A | * | 1/1980 | Narayan et al. | ............ 438/473 |
| 6,043,800 A | * | 3/2000 | Spitzer et al. | .................. 345/8 |
| 6,210,981 B1 | * | 4/2001 | Birdsley et al. | ................ 438/9 |
| 6,255,128 B1 | * | 7/2001 | Chacon et al. | ................. 438/17 |
| 6,607,927 B2 | * | 8/2003 | Ramappa et al. | ............. 438/14 |
| 6,818,459 B2 | * | 11/2004 | Wack et al. | ................... 438/14 |
| 6,849,831 B2 | * | 2/2005 | Timans et al. | .............. 219/390 |
| 2005/0124080 A1 | * | 6/2005 | Wu et al. | ...................... 438/14 |

\* cited by examiner

*Primary Examiner*—Walter L. Lindsay, Jr.
(74) *Attorney, Agent, or Firm*—Townsend and Townsend and Crew LLP

(57) ABSTRACT

A method for processing semiconductor wafers, e.g., silicon. The method includes providing a monitor wafer, which is made of a crystalline material. The method includes introducing a plurality of particles within a depth of the material, whereupon the plurality of particles cause the crystalline material to be in an amorphous state. The method also includes introducing a plurality of dopant particles into a selected depth of the crystalline material in the amorphous state using an implantation tool. The amorphous state traps the dopant particles. The method includes subjecting the monitor wafer including the plurality of particles and dopant particles into thermal anneal process to activate the dopant. The sheet resistivity is measured. The method operates the implantation tool using one or more production wafers if the dose of the dopant particles in the monitor water is within a tolerance of a specification limit.

21 Claims, 6 Drawing Sheets

Table 1 The effect of silicon implantation on Boron activation.
Implantation conditions: Silicon/20KeV/1E15 before Boron/2KeV/4E14;
annealing conditions: 700°C, 30 seconds, N$_2$ as annealing ambient

| | Implantation | Annealing | Rs/Uniformity(%) |
|---|---|---|---|
| Implanted with both Si and B | Si/20K/1E15/T07+ B/2K/40E4/T00 | T0700RTA30S | 442.72/0.329% |
| Implanted with B only | B/2K/40E4/T00 | | 7940.3/1.352% |

*FIG. 9*

LOW ENERGY DOSE MONITORING OF IMPLANTER USING IMPLANTED WAFERS

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

The present invention is directed integrated circuits and their processing for the manufacture of semiconductor devices. More particularly, the invention provides a method for monitoring a low energy dose implantation process for the manufacture of integrated circuits. But it would be recognized that the invention has a much broader range of applicability. For example, the invention can be applied to a variety of devices such as dynamic random access memory devices, static random access memory devices (SRAM), application specific integrated circuit devices (ASIC), microprocessors and microcontrollers, Flash memory devices, and others.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed.

An example of a semiconductor process that is important to make smaller and smaller devices is ion implantation for shallow junction MOS devices. Shallow junction MOS devices often require low energies but high impurity doses. Certain types of implantation such as boron use implant energies of 2 keV and possibly less. Such implant energies and doses are often difficult to monitor accurately. Here, measurement of implant depth and other parameters are often difficult or impossible using conventional techniques. In certain conventional techniques, screen oxides are formed on wafers before implantation. Low energy impurities often become trapped in the oxide layer and do not even reach the underlying silicon material. Resistance measurements of such oxide coated wafers cannot be made accurately. Alternatively, bare silicon wafers are also implanted with impurities. These wafers often out diffuse the implanted impurities, which cannot be measured to any degree of accuracy. Accordingly, it is difficult to accurately monitor low energy implants for the manufacture of semiconductor devices.

From the above, it is seen that an improved technique for processing semiconductor devices is desired.

BRIEF SUMMARY OF THE INVENTION

According to the present invention, techniques for processing for the manufacture of semiconductor devices are provided. But it would be recognized that the invention has a much broader range of applicability. More particularly, the invention provides a method for monitoring a low energy dose implant process for the manufacture of integrated circuits. For example, the invention can be applied to a variety of devices such as static random access memory devices (SRAM), application specific integrated circuit devices (ASIC), microprocessors and micro controllers, Flash memory devices, and others.

In a specific embodiment, the invention provides a method for processing semiconductor devices. The method includes providing a monitor wafer, which comprising a silicon material. The method includes introducing a plurality of particles within a depth of the silicon material, whereupon the plurality of particles (e.g., silicon) cause the silicon material to be in an amorphous state. The method also includes introducing a plurality of dopant particles (e.g., boron, arsenic) into a selected depth of the silicon material using an implantation tool. Preferably, the amorphous state traps the dopant particles and may even cause recrystallization of the amorphous silicon material. The method also includes subjecting the monitor wafer including the plurality of particles and dopant particles into thermal anneal process to activate the dopant. The wafer is removed. The method includes measuring a sheet resistivity of a surface region including the implanted dopant particles of the monitor wafer and determining a dose of the dopant bearing impurities. Next, the method includes operating the implantation tool using one or more production wafers if the dose of the dopant particles in the monitor water is within a tolerance of a specification limit.

In a specific alternative embodiment, the invention provides a method for processing semiconductor wafers, e.g., silicon. The method includes providing a monitor wafer, which is made of a crystalline material. The method includes introducing a plurality of particles within a depth of the material, whereupon the plurality of particles cause the crystalline material to be in an amorphous state. The method also includes introducing a plurality of dopant particles into a selected depth of the crystalline material in the amorphous state using an implantation tool. The amorphous state traps the dopant particles. The method includes subjecting the monitor wafer including the plurality of particles and dopant particles into thermal anneal process to activate the dopant. A sheet resistivity is measured. The method operates the implantation tool using one or more production wafers if the dose of the dopant particles in the monitor wafer is within a tolerance of a specification limit.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention can be applied to a variety of applications such as memory, ASIC, microprocessor, and other devices. Preferably, the invention provides a way to monitor a low energy dose implantation process for shallow junction devices. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIGS. 7 through 9 are simplified plots of experimental results according to embodiments of the present invention

DETAILED DESCRIPTION OF THE INVENTION

Figure 1:
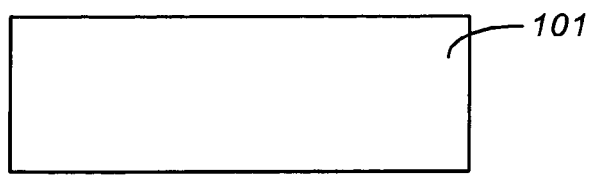
FIGS. 1 through 6 are simplified cross-sectional view diagrams illustrating a method according to an embodiment of the present invention.

According to the present invention, techniques for processing for the manufacture of semiconductor devices are provided. But it would be recognized that the invention has a much broader range of applicability. More particularly, the invention provides a method for monitoring a low energy dose implantation process for the manufacture of integrated circuits. For example, the invention can be applied to a variety of devices such as static random access memory devices (SRAM), application specific integrated circuit devices (ASIC), microprocessors and micro controllers, Flash memory devices, and others.

A method for fabricating a monitor substrate to monitor a low energy dose implantation process according to an embodiment of the present invention is provided as follows:

1. Provide a monitor wafer, e.g., silicon wafer;
2. Introduce a plurality of particles (e.g., silicon) within a depth of the silicon material to cause an amorphous state within the silicon material;
3. Introduce boron at low energy and high dose into a depth of the monitor wafer;
4. Subject the monitor wafer including the plurality of particles and boron into a rapid thermal anneal process at about 700 Degrees Celsius to activate the boron bearing particles;
5. Remove the monitor wafer;
6. Measure a sheet resistivity of the monitor wafer;
7. Perform steps 1 through 6 for other monitor wafers having different doses of boron impurities; and
8. Plot the relationship of sheet resistivity to boron doses; and
9. Perform other steps, as desired The above sequence of steps is used to prepare a monitor wafer. The monitor wafer is used to make a calibration curve, which will be used to determine a dose of an impurity for another monitor water. The calibration curve can be adjusted depending upon the embodiment. Further details of the present method can be found according to the Figures below.

A method for manufacturing an integrated circuit device using an implantation process according to an embodiment of the present invention can be provided as follows:

1. Provide a monitor wafer, e.g., silicon wafer;
2. Introduce a plurality of particles (e.g., silicon) within a depth of the silicon material to cause an amorphous state within the silicon material;
3. Introduce boron at low energy and high dose into a depth of the monitor wafer;
4. Subject the monitor wafer including the plurality of particles and boron into a rapid thermal anneal process at about 700 Degrees Celsius to activate the boron bearing particles;
5. Remove the monitor wafer;
6. Measure a sheet resistivity of the monitor wafer;
7. Perform steps 1 through 6 for other monitor wafers having different doses of boron impurities; and
8. Plot the relationship of sheet resistivity to boron doses;
9. Provide monitor water for production run;
10. Perform steps 1–6;
11. Determine dose of impurity based upon plot;
12. Determine of the dose is within a predetermined tolerance limit for the implantation process;
13. Perform production operation of product waters using the implantation process if the dose is within the predetermined tolerance;
14. Alternatively, transfer implantation process to maintenance or engineering or calibration;
15 Perform other steps, as desired FIGS. 1 through 6 are simplified cross-sectional view diagrams illustrating a method 100 according to an embodiment of the present invention. These diagrams are merely illustrations, which should not unduly limit the scope of the claims herein. One of ordinary skill in the art would recognize many other variations, modifications, and alternatives. As shown, the method 100 begins by providing a monitor substrate 101, which can be a silicon wafer or the like. Alternative substrates can include any suitable material such as epitaxial silicon and silicon on insulator substrate. Preferably, the monitor substrate is a silicon wafer.

Figure 2:
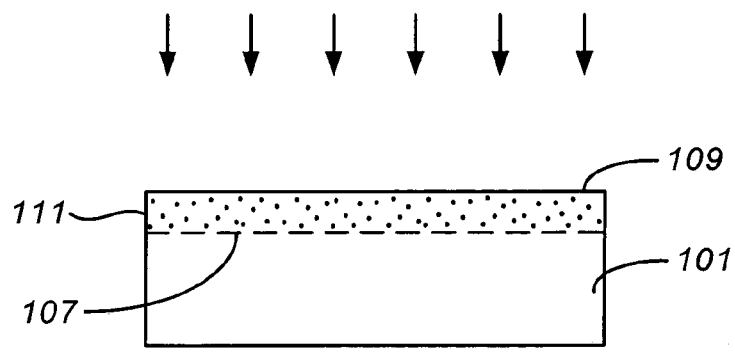
Figure 3:
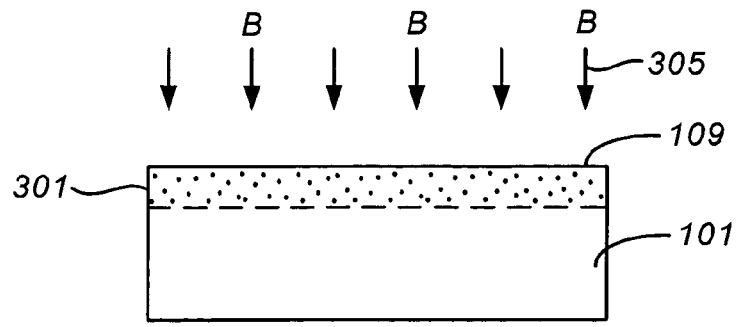

Referring to FIG. 2, the method introduces a plurality of particles 105 to cause an amorphous state within a thickness 111 of the monitor substrate. The thickness is defined to a predetermined depth 107, which can be constant or vary slightly, depending upon the application. The particles are introduced through the surface 109 of the substrate using implantation techniques or others. As shown, the particles can be silicon bearing particles such as elemental silicon. Such silicon bearing particles can be derived from gases such as silane, dichlorosilane, any combination of these, and others. Further details of the amorphous state are described throughout the present specification and more particularly below.

Next, the method introduces a dopant impurity 305 at low energy and high dose into a depth 301 of the monitor substrate. The dopant impurity can be a boron bearing species, an arsenic bearing species, and others. The energy is often 2 KeV to less than 2 KeV, but can also be others. The dose is $4\times10^{14}$ to $1\times10^{15}$ atoms/cm$^2$, but can also be others. Preferably, the method is used for low energy high dose impurities for shallow junction devices. These devices often have junction depths of less than 40 nm, but can also be at other depths. Additionally, the shallow junction devices are often for line rules of less than 0.15 um. Of course, the particular energies, doses, and depths depend upon the application.

Figure 4:
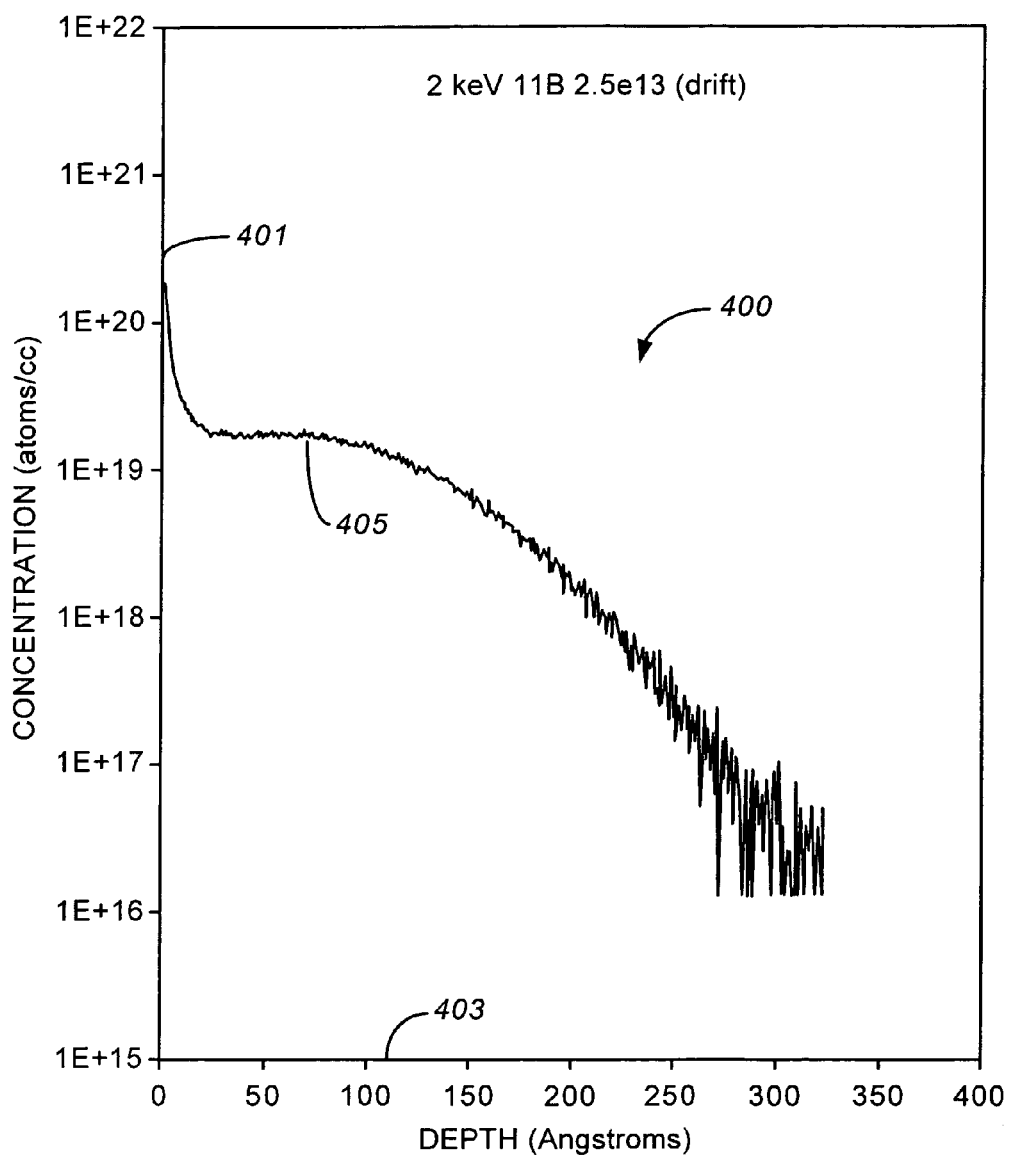

Referring to FIG. 4, implanted profile 400 as a function of depth is illustrated. This profile is merely an example, which should not unduly limit the scope of the claims herein. One of ordinary skill in the art would recognize many alternatives, variations, and modifications. As shown, the vertical axis 401 illustrates concentration. The horizontal axis 403 illustrates depth from the surface of the monitor substrate to the predetermined depth. The profile 405 is substantially even and then reduces in concentration as a function of depth. Further details of such profile are provided below.

Figure 4A:
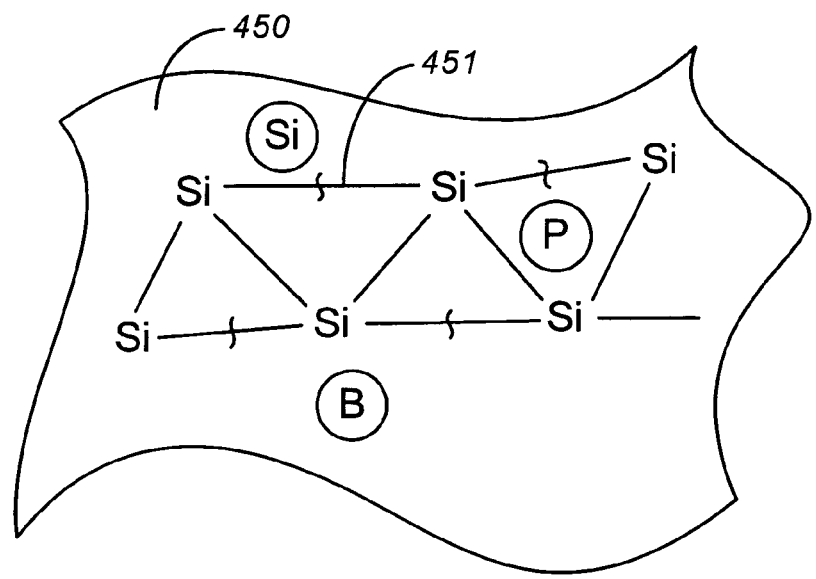
FIG. 4A is a simplified cross-sectional view diagram of a portion of a semiconductor substrate according to an embodiment of the present invention.

FIG. 4A is a simplified cross-sectional view diagram of a portion of a semiconductor substrate according to an embodiment of the present invention. This diagram is merely an example, which should not unduly limit the scope of the claims herein. One of ordinary skill in the art would recognize many alternatives, variations, and modifications. The portion 450 of the substrate includes silicon bearing species and boron bearing species. Some of the silicon bearing species are from the original substrate material. Other silicon bearing species have been implanted. Such silicon bearing species have broken bonds 451 and form an amorphous state within the substrate. The substrate is substantially free from an overlying oxide layer, which may interfere with boron implantation. There may be a very small layer of oxide, but is substantially ineffective as a screen oxide or other like material. Boron bearing species are also included. Such boron bearing species have not been activated in part according to a specific embodiment. Accordingly, the monitor substrate including the implanted species should be subjected to a thermal process, such as rapid thermal anneal.

Here, the method subjects the monitor substrate including the plurality of particles and boron into a rapid thermal anneal process at about 700 Degrees Celsius to activate boron. Depending upon the embodiment, other temperatures can be used. For example, the temperature can range from about 650 Degrees Celsius to about 700 Degrees Celsius. The rapid thermal anneal process also recrystallizes certain portions of the-amorphous state silicon material. The monitor substrate is then removed and ready for subsequent processing.

The method measures a sheet resistivity of the monitor substrate. The sheet resistivity can be measured using a probe tool such as KLA Tencor Rs-75, but can also be others. The sheet resistivity is kept for further analysis. The method then performs the above steps for other monitor wafers having different doses of boron impurities. The doses have also been provided with a tool that has been calibrated according to a preferred embodiment.

Figure 5:
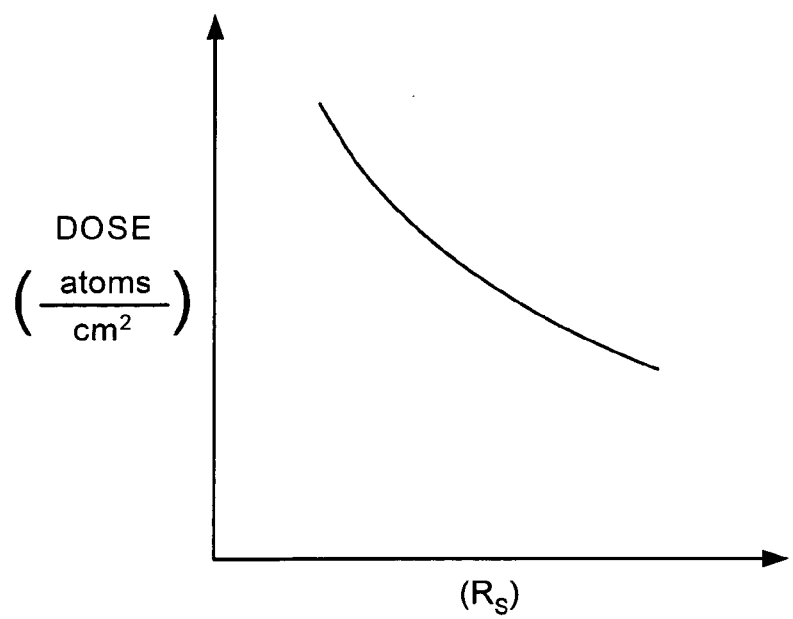

Referring to FIG. 5, the method plots the relationship of sheet resistivity to boron doses according to a specific embodiment. As shown, the monitor wafers include different respective doses, which have been plotted against sheet resistivities. Here, the plot provides a standard to be used in performing, for example, process checks on a specific tool being monitored. The horizontal axis represents sheet resistivity values, and the vertical axis represents doses. As shown, the sheet resistivity increases with lower doses as a general trend. Depending upon the embodiment, any of the above steps may be modified. Alternative processes may be included. The order of the specific steps may also be altered without departing from the scope of the claims herein. One of ordinary skill in the art would recognize many other variations, modifications, and alternatives.

Although the above has been illustrated according to a specific embodiment, there can be other modifications, alternatives, and variations. For example, boron has been used as an impurity, but other impurities such as arsenic and phosphorus can also be used. Additionally, a third implant can also be used to form the monitor substrate. Further, additional ways of causing the amorphous state can also be used. It is also understood that the examples and embodiments described herein are for illustrative purposes only and that various modifications or changes in light thereof will be suggested to persons skilled in the art and are to be included within the spirit and purview of this application and scope of the appended claims.

Figure 6:
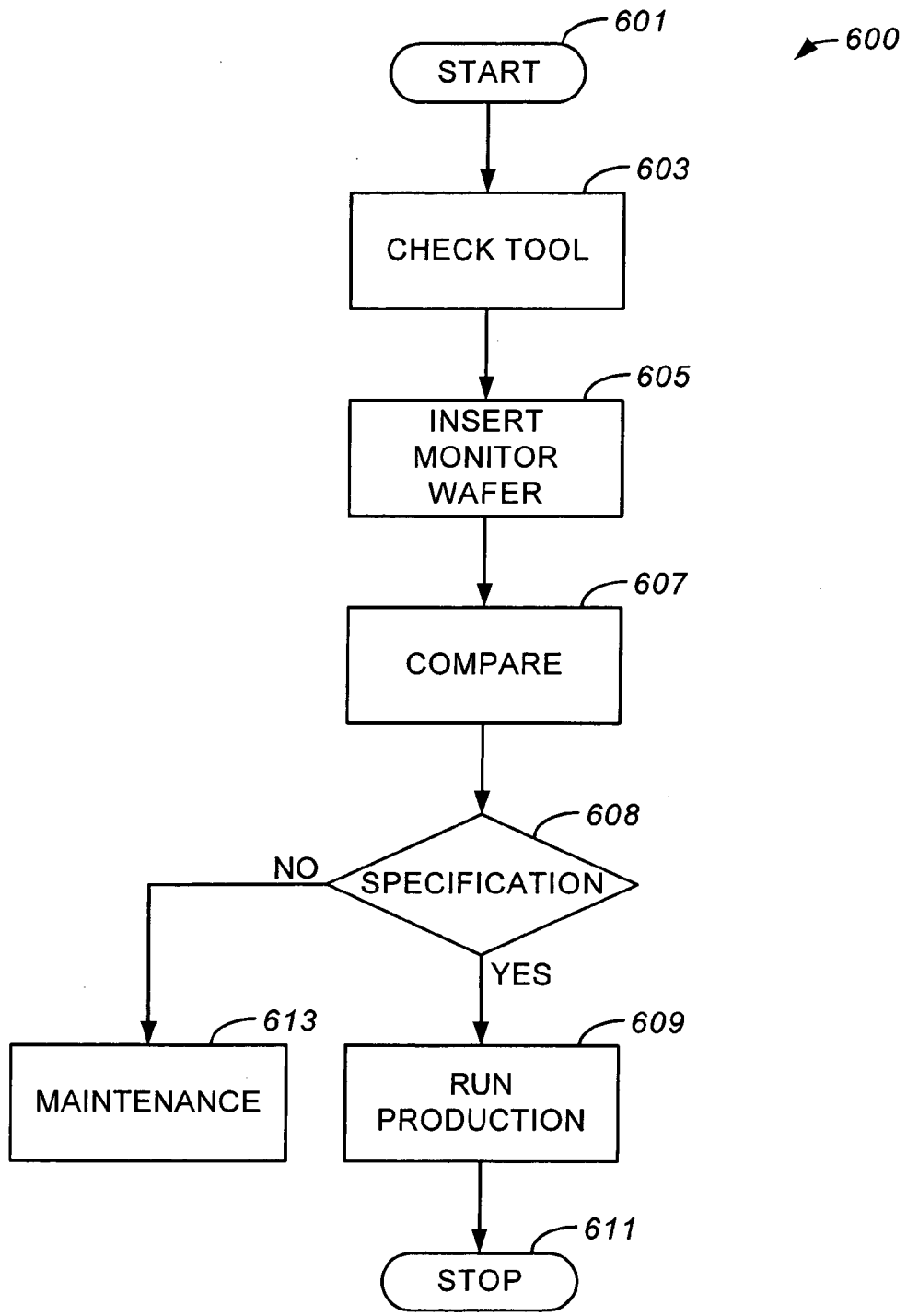

In a specific embodiment, the invention also provides a method for manufacturing an integrated circuit device using an implantation process according to an embodiment of the present invention. Here, the method can be used to check the process of a specific implantation tool. The method is often performed during a predetermined frequency or other desirable times for the specific implantation tool. As shown in FIG. 6, the method begins at start, step 601. The method is performed for checking a specific implantation tool, step 603. Before production operation, a monitor wafer is (step 605) inserted into the specific implantation tool, which would be evaluated.

The method introduces a plurality of particles (e.g., silicon) within a depth of a silicon material to cause an amorphous state within the silicon material. The method then introduces boron at a selected low energy and a selected high dose into a depth of the monitor wafer. The dopant impurity can be a boron bearing species, an arsenic bearing species, and others. The selected low energy is often 2 KeV to less than 2 KeV, but can also be at others. The selected high dose is $4 \times 10^{14}$ to $1 \times 10^{15}$ atoms/cm$^2$, but can also be others. Preferably, the method is used for low energy high dose impurities for shallow junction devices. These devices often have junction depths of less than 40 nm, but can also be at other depths. Additionally, the shallow junction devices are often for line rules, of less than 0.15 um. Preferably, the dose and the energy are pre-selected but are provided for process checking before a production run of wafers. Of course, the particular energies, doses, and depths depend upon the application.

The method then subject the monitor wafer including the plurality of particles and boron into a rapid thermal anneal process at about 700 Degrees Celsius to activate the boron bearing particles. Depending upon the embodiment, other temperatures can be used. For example, the temperature can range from about 650 Degrees Celsius to about 700 Degrees Celsius. The rapid thermal anneal process also recrystallizes certain portions of the silicon material. Preferably, the temperature is pre-selected for the process check. The monitor wafer is then removed and ready for subsequent processing.

The method measures a sheet resistivity of the monitor wafer. The sheet resistivity can be measured using a probe tool such as KLA Tencor Rs-75, but can also be others. The method then determines (step 607) a dose of impurity based upon plot, which has been previously explained. The method determines (step 608) if the dose is within a predetermined tolerance limit for an implantation process. The predetermined tolerance is often a specification limit for the particular implantation process. If a tool is in specification, the method releases the tool to run production waters, step 609.

Alternatively, the method turns the tool over to a maintenance and/or calibration process, step 613. Preferably, the method runs production for at least 24 hours until another monitor water is checked to ensure the quality of the process. The method stops at step 611.

Although the above has been illustrated according to a specific embodiment, there can be other modifications, alternatives, and variations. For example, boron has been used as an impurity, but other impurities such as arsenic and phosphorus can also be used. Additionally, a third implant can also be used to form the monitor substrate. Further, additional ways of causing the amorphous state can also be used. It is also understood that the examples and embodiments described herein are for illustrative purposes only and that various modifications or changes in light thereof will be suggested to persons skilled in the art and are to be included within the spirit and purview of this application and scope of the appended claims.

Experiments:

To prove the principle and operation of the present invention, we performed experiments. These experiments are merely examples, which should not unduly limit the scope of the claims herein. One of ordinary skill in the art would recognize many variations, alternatives, and modifications. Further details of such experiments are provided throughout the present specification and more particularly according to the figures below.

We performed these experiments using conventional tools and a desire to discover improved processes for semiconductor integrated circuits. Continued device scaling often requires a formation of ever-shallower, low-resistance junctions. The use of ultra-low energy implant and spike anneals make it possible to develop sub-micron technology. A combination of ultra-low energy implant and spike anneals are often desirable to form ultra shallow junctions. The implantation energy can be lowered to sub KeV level. It is often necessary to monitor low energy implantation performance. Annealing is a big issue for low energy implantation monitor, out-diffusion happens when annealing without O2 or screen oxide, resulting in non-uniformity; annealing with O2 or screen oxide will often impact dosage measurement accuracy. Here, silicon implantation was used to form amorphous silicon before boron implantation. The wafer can be annealed at a lower temperature without O2 or screen oxide.

Figure 7:
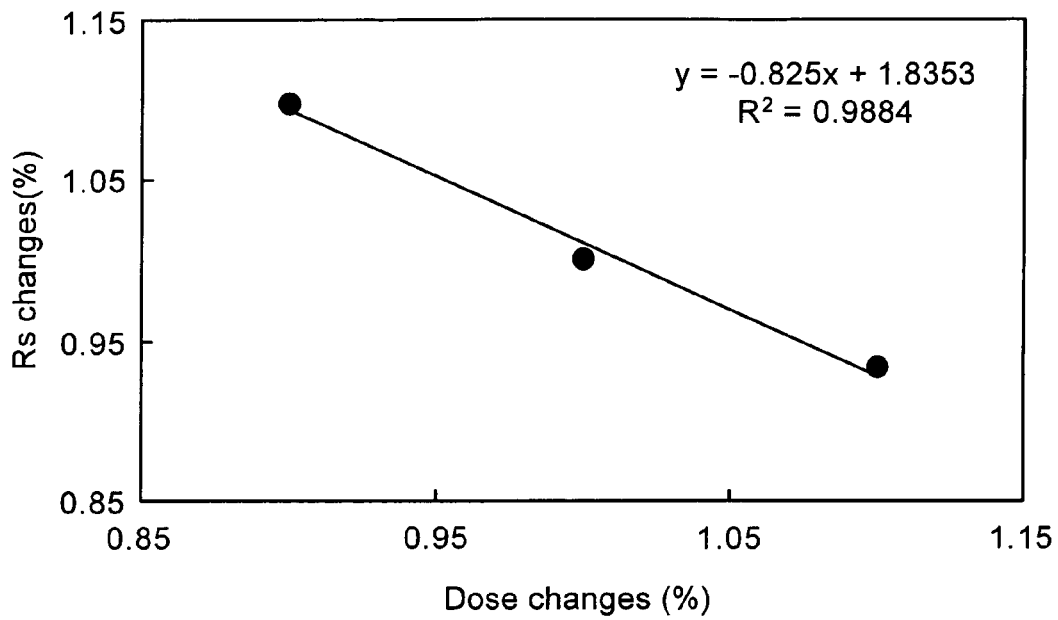
Figure 8:
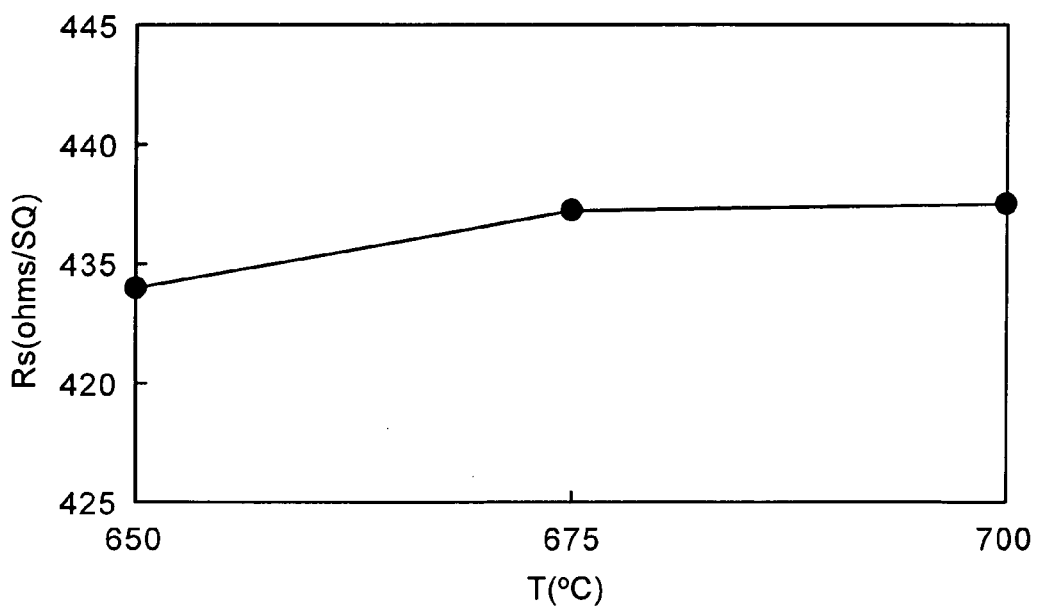

Referring to FIG. 7, we plotted Rs-to-dose sensitivity testing results. The implantation conditions included silicon/20KeV/1×10$^{15}$ atoms/cm$^2$ before boron/2KeV/4×10$^{14}$ atoms/cm$^2$. Annealing conditions included 700° C., 30 seconds, N$_2$ as annealing ambient. Referring to FIG. 8, we have demonstrated the dependence of Rs changes upon annealing temperature. Here, implantation conditions included silicon/20KeV/1×10$^{15}$ atoms/cm$^2$ before boron/2KeV/4×10$^{14}$ atoms/cm$^2$ and annealing conditions used were from 650 to 700° C., 30 seconds, N$_2$ as annealing ambient.

We have provided our results in Table 1 of FIG. 9, which shows the effect of silicon implantation on boron activation. Here, implantation conditions included silicon/20KeV/1×10$^{15}$ atoms/cm$^2$ before boron/2KeV/4×10$^{14}$ atoms/cm$^2$ and annealing conditions were 700° C., 30 seconds, N2 as annealing ambient. As shown in Table 1, implantation with boron only showed very high sheet resistance. Boron implanted into the wafer was not activated. Silicon implantation before Boron implantation can be helpful for boron activation, an Rs of 442.7 ohms/cm$^2$ was obtained (uniformity: 0.33%).

As has been demonstrated, a step of silicon implant to cause amorphous silicon in a pre-determined depth before boron implant can aid in boron activation. No oxygen or screen oxide was needed for annealing, which improves accuracy in monitoring low energy implanter. A sensitivity of 0.83% (ΔRs/ΔDose) was obtained in the present study. Of course, one of ordinary skill the art would recognize many variations, alternatives, and modifications.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for processing integrated circuit devices, the method comprising:

providing a monitor wafer, the monitor wafer comprising a silicon material;

introducing a plurality of particles within a depth of the silicon material, whereupon the plurality of particles cause the silicon material to be in an amorphous state;

introducing a plurality of dopant particles into a selected depth of the silicon material using an implantation tool, the amorphous state trapping the dopant particles;

subjecting the monitor wafer including the plurality of particles and dopant particles into thermal anneal process to activate the dopant;

removing the monitor wafer;

measuring a sheet resistivity of a surface region including the implanted dopant particles of the monitor wafer;

determining a dose of the dopant bearing impurities; and operating the implantation tool using one or more production wafers if the dose of the dopant particles in the monitor wafer is within a tolerance of a specification limit.

2. The method of claim 1 wherein the monitor wafer is substantially free of screen oxide overlying a surface of the monitor wafer.

3. The method of claim 1 wherein the plurality of particles are silicon bearing species.

4. The method of claim 3 wherein the silicon bearing species are implanted using a dose of 1×10$^{15}$ atoms/cm$^2$ and an energy of 20 keV.

5. The method of claim 1 wherein the dopant particles are boron bearing impurities.

6. The method of claim 5 wherein the boron bearing impurities are implanted using a dose ranging from about 4×10$^{14}$ through 1×10$^{15}$ atoms/cm$^2$ and an energy ranging from about 1–2 keV.

7. The method of claim 1 wherein the thermal anneal process is an RTP process at about 700 Degrees Celsius.

8. The method of claim 1 wherein the thermal anneal process is an RTP process ranging from about 650 to 750 Degrees Celsius.

9. The method of claim 1 wherein the thermal anneal process is a rapid thermal anneal process.

10. The method of claim 1 wherein the sheet resistivity is provided in a separate tool.

11. The method of claim 1 wherein the operating of the implantation tool occurs for 24 hours after determining the dose of the dopant impurities.

12. The method of claim 1 wherein the thermal anneal process also recrystallizes a portion of the amorphous silicon.

13. A method for processing semiconductor wafers, the method comprising:

providing a monitor wafer, the monitor wafer comprising a crystalline material;

introducing a plurality of particles within a depth of the material, whereupon the plurality of particles cause the crystalline material to be in an amorphous state;

introducing a plurality of dopant particles into a selected depth of the crystalline material in the amorphous state using an implantation tool, the amorphous state trapping the dopant particles;

subjecting the monitor wafer including the plurality of particles and dopant particles into thermal anneal process to activate the dopant;

removing the monitor wafer;

measuring a sheet resistivity of a surface region including the implanted dopant particles of the monitor wafer;

determining a dose of the dopant bearing impurities; and operating the implantation tool using one or more production wafers if the dose of the dopant particles in the monitor wafer is within a tolerance of a specification limit.

14. The method of claim 13 wherein the crystalline material comprises silicon.

15. The method of claim 13 wherein the dose of the dopant bearing impurities is determined using a relationship between resistivity values and dose values.

16. The method of claim 15 wherein the relationship has been provided in a spatial plot.

17. The method of claim 13 wherein the plurality of particles comprise silicon bearing particles.

18. The method of claim 13 wherein the dopant bearing impurities comprise boron species.

19. The method of claim 13 wherein the monitor water is substantially free from an overlying oxide layer before introducing the dopant bearing impurities.

20. The method of claim 13 wherein the monitor wafer is a silicon wafer.

21. The method of claim 13 wherein the one or more production wafers is characterized by a shallow junction depth of less than about 40 nm.

* * * * *